United States Patent
Yeh et al.

(12) 
(10) Patent No.: US 6,503,578 B1
(45) Date of Patent: Jan. 7, 2003

(54) METHOD FOR PREPARING ZNSE THIN FILMS BY ION-ASSISTED CONTINUOUS WAVE $CO_2$ LASER DEPOSITION

(75) Inventors: Pey-Shiun Yeh, Hsin-Chu (TW); Jyh-Shin Chen, Hsin-Chu (TW); Cheng-Chung Jaing, Hsin-Chu (TW); Hsiang-Ming Tseng, Hsin-Chu (TW); Long-Sheng Liao, Hsin-Chu (TW); Ming-Chih Lee, Hsin Chu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/565,473

(22) Filed: May 5, 2000

(51) Int. Cl.[7] .................... C23C 14/28; C23C 14/48; B05D 5/06

(52) U.S. Cl. ............... 427/530; 427/527; 427/596; 427/162

(58) Field of Search .............. 427/528, 530, 427/531, 561, 596, 597, 527, 162

(56) References Cited

U.S. PATENT DOCUMENTS

| | | | |
|---|---|---|---|
| 4,584,053 A | | 4/1986 | Namba et al. ............. 156/603 |
| 4,837,044 A | * | 6/1989 | Murarka et al. ............ 427/596 |
| 4,866,007 A | | 9/1989 | Taguchi et al. ............ 437/108 |
| 5,174,854 A | | 12/1992 | Sano et al. ................. 156/621 |
| 5,192,419 A | | 3/1993 | Matsuura et al. .......... 205/244 |
| 5,242,706 A | * | 9/1993 | Cotell et al. ............... 427/596 |
| 5,279,868 A | * | 1/1994 | Ohtsuka et al. ............ 427/561 |
| 5,330,611 A | * | 7/1994 | Doll ........................... 117/105 |
| 5,432,151 A | * | 7/1995 | Russo et al. ............... 427/596 |
| 5,499,599 A | * | 3/1996 | Lowndes et al. ............ 117/50 |
| 5,616,178 A | | 4/1997 | Toda et al. ................. 117/104 |

OTHER PUBLICATIONS

Kobayashi et al, Jpn. J. Appl. Phys., vol. 36, Part 1, No. 5, "Surface Morphology and Carbon . . . ", pp. 2592–2595, May 1997.

Kurobe et al, Applied Physics Letters, vol. 73, No. 16, "Preferential growth of cubic . . . ", pp. 2305–2307, Oct. 19, 1998.

Stutius, Appl. Phys. Lett. 33(7), "Organometallic vapor deposition of expitaxial . . . ", pp. 656–658, Oct. 1, 1978.

Simpson et al, Applied Surface Science 46, "Preferential (111) orientation of ZnSe on (100) . . . ", pp. 27–31, 1990 No month.

Sou et al, Journal of Crystal Growth 147, "High–resolution X–ray diffraction study of ZnSe . . . ", pp. 39–46, 1995.

* cited by examiner

Primary Examiner—Marianne Padgett
(74) Attorney, Agent, or Firm—Jacobson Holman PLLC

(57) ABSTRACT

Zincselenide (ZnSe) thin films were grown on quartz glass and GaAs(100) substrates by continuous wave (CW) $CO_2$ laser with ion beam assisted deposition. The ZnSe thin films are applied for multilayer anti-reflection coatings and blue light emitting devices. There are advantages to this technique over the Ion-Beam coating, MBE, MOCVD and PLD methods for fabricating layered semiconductors. It is cheaper and safer than Ion-Beam coating, MBE, MOCVD and others. It is cheaper and safer to heat the target locally by using a continuous wave laser so that contaminations and heat radiation are reduced. It is also cheaper and safer to avoid the splash of PLD.

3 Claims, 13 Drawing Sheets

METHOD FOR PREPARING ZNSE THIN FILMS BY ION-ASSISTED CONTINUOUS WAVE CO₂ LASER DEPOSITION

BACKGROUND OF THE INVENTION

1. Field of the Invention

This invention is applied to grow a ZnSe thin film on glass and GaAs substrates by using the continuous wave (CW) $CO_2$ laser evaporation with ion-assisted system to produce optical multi-layer films, anti-reflection coating and blue light emitting devices.

To grow ZnSe thin films on substrates and deposited plating films then manufacture blue light emitting devices, there are usually two methods applied in the industry. One is using metal organic chemical vapor deposition (MOCVD) and the other is using Molecular Beam Epitaxy (MBE). The former method has been applied on GaAs(100) substrates, and the latter also has been used to deposit some epitaxy films on GaAs substrates or GaN epitaxy films on sapphire substrates.

At the present time, the most popular thin film epitaxy methods are the above-said MOCVD and MBE. The first method is more dangerous because its materials are organic metals; however, the second also has a weakness. It is expensive and thus difficult to mass-produced.

2. Description of the Prior Art

As for MOCVD, organic metal molecules are led through gas ducts into the chamber, and then are deposited on high temperature substrates. Through thermal decomposition, a film will be formed on the surface of substrate. There are many successful cases on growth of a ZnSe thin film. In Appl. Phys. Lett. (Vol. 33, p.656, 1978), Stutius et al. it is stated that they had successfully grown ZnSe thin film on GaAs substrates. They were using $Zn(CH_3)_2$ and $H_2Se$ as Zn and Se's precursors. The high quality ZnSe epitaxy films were grew on 300 to 350° C. substrates at a growth rate of 2 μm/hr, under a total system pressure of 0.15 torr, at the 5:1 ratio of Se and Zn in gas. According to X-ray survey results, the ZnSe (400) formed had the narrowest width at its Full-Width Half-Maximum (FWHM) peak, a symbol of the best thin film quality. Analyzed by the Photoluminescence measurement in an ambient temperature, it emitted at the near-band gap of 447 nm without remarkable defects. It appeared that the films on the substrate were a high-quality light emitting epitaxy layer with no remarkable defects on it. In addition to Stutius' study, Simpson and Williams published their MOCVD techniques in 1990 in Appl. Surface Science (Vol. 46, p.27). They used $Zn(CH_3)_2$ and $Se(CH_3CH_2)_2$ as precursors of Zn and Se to grow ZnSe on GaAs (100) substrates at a temperature of 275 to 350° C. In such conditions, high-quality single crystal ZnSe was formed.

Apart from growth of high-quality ZnSe thin films, MOCVD is also applied to the field of GaN epitaxy, as one of the blue light emitting devices. In 1997, Kobaashi et al. published in Jpn. J. Appl. Phys. (Vol. 36, p.2592) that using DMHy and $Ga(CH_3)_3$ as precursors of N and Ga could improve the disadvantages of high temperature in traditional methods. The traditional methods of growing GaN was under high temperature conditions, especially temperatures higher than 1,000° C. Kobaashi's methods adopted two approaches. One approach was to grow a GaN buffer layer first at a lower temperature of 530°, then grow the GaN epitaxy at 770° C. The other approach was to grow AlN buffer layer at 700° C. and then grow GaN at 850° C. The results showed that the best film quality could be achieved by the second approach at 850° C., V/III ratio of 60 at total 300 Torr system pressure.

Another high quality epitaxy technique is the Molecular Beam Epitaxy (MBE). In ultra high vacuum conditions, atoms are heated into steam and sprayed on substrates to cause interaction and form the epitaxy films. In 1993, Reichow et al. used this technique to form ZnSe epitaxy on GaAs substrates by letting the Zn atom flow first to prevent formation of $Ga_2Se_3$. Reichow et al found that they could grow 1–2 μm ZnSe thin film at 331–350° C. By measuring with X-ray Diffraction Spectrometer, the FWHM of ZnSe (400) peak was 200 arcsec, an excellent crystal films quality. In 1995, another method was published by Sou et al. on J. Crystal.Growth (Vol. 147, p.39). With preheating to remove oxide contamination of substrate, Sou et al found that they could grow 0.45 to 1.6 μm of ZnSe thin film at a growth rate of 0.18 to 0.36 μm/h at 300° C., letting in Zn atom flow first for one minute and then Se atom flow under a constant pressure ratio of 1:33. Analyzed by high-resolution X-ray Diffraction Spectrometer, the half-height width of ZnSe (400) wave also reached 200 arcsec. Both cases showed that MBE can produce very good crystallization of ZnSe thin film.

The same approach can be applied to grow high-quality GaN epitaxy. On Appl. Phys. Lett., Lurobe et al. stated that high-quality GaN epitaxy films were achieved on sapphire substrates at 800° C. at a speed of 0.35 μm, using $Ga(C_2H_5)_3$ and Nitrogen plasma as the resources of Ga and N (Vol. 73, p.2305, 1998). According to the results of X-ray diffraction spectrometer analysis, this approach could also grow high-quality GaN epitaxy.

A bulk crystal ZnSe producing method, covered in U.S. Pat. No. 4,866,007, is stated as follows:

(1) Put the initial material, bar-type polycrystal ZnSe, into the reaction Chamber;

(2) Fill in mixture of Noble Gas, Nitrogen, and $H_2Se$ at 0.1 to 100 Torr; and (3) Move the polycrystal material through a high temperature passage and let it transform into single crystal ZnSe material at a speed of 5 mm/day.

Another approach covered in U.S. Pat. No. 4,584,053 is to prepare ZnSe single crystal for a large area with features of high quality and low impurity. The points are: plate polycrystal ZnSe by CVD, seal it in capsules, and under high temperature and pressure conditions transform it into single crystal material for producing crystal film substrates.

In U.S. Pat. No. 5,174,854, an approach for crystal growth of group II-VI compound semiconductors is stated. It is to dissolve Se in Zn solvent to the extent of saturation under the conditions of high temperature and 6–9 atm, place substrates under 10 w temperature conditions, and thus grow single crystal ZnSe.

However, U.S. Pat. No. 5,616,178 covers the way to plate p-type ZnSe by MOCVD. The initial material used in this approach is p-type organic substance that should have at least something like di-isopropylamine.

A method for growing p-type ZnSe (for producing a zinc selenide blue light emitting device), covered in U.S. Pat. No. 5,192,419, is called Electrochemical Accumulation. The method includes bathing an anode (with Zinc) and single crystal ZnSe substrates in the Zn and Se ion solution. When electricity flows from zinc anode to n-type ZnSe substrate (cathode), p-type ZnSe will accumulate on n-type ZnSe cathode to form a pn-junction ZnSe semiconductor.

A single crystal growth method, using devices to melt substance under high-pressure conditions, such as in a vertical Boogiemen high temperature oven, is covered in U.S. Pat. No. 5,554,219. In this approach, ZnSe is melted at high temperature and then grows into single crystal material through proper procedures.

In U.S. Pat. No. 5,015,327, a method to grow ZnSe thin films on ZnSe substrates is as follows: (1) heat substrates from 250° C. to 450° C. at 0.1 to 10 Torr of Hydrogen pressure; and (2) fill in $Zn(CH_3)_2$ or $Zn(C_2H_5)_2$ and $H_2Se$ gas at a 1:10 to 100 of Se and Zn Mole ratio. In such conditions, ZnSe thin films can successfully grow on single crystal ZnSe substrates.

SUMMARY OF THE INVENTION

The purpose of this invention is to use an ion-assisted CW $CO_2$ laser deposition system which can grow ZnSe thin films on substrates to produce optical multilayer films and anti-reflection films for blue light emitting devices.

DETAILED DESCRIPTION OF THE INVENTION

This invention is a continuous wave (CW) $CO_2$ laser with ion-assisted system, which can grow ZnSe thin films on substrates to produce optical multilayer films and anti-reflection films which can be applied to manufacture quartz glass substrates and GaAs substrates, ZnSe substrates, and sapphire substrates, as well as grow GaN films on such substrates.

With the system, the optical multilayer films and anti-reflection films can be used for blue light emitting devices.

The ZnSe target, made by suppression of ZnSe particles (99.99%), is exposed to the CW $CO_2$ laser, and, when vaporized, coating it on GaAs (100) and quartz glass substrates. The ion beam can be of great help to its growth.

The parameters of deposition procedures using this CW $CO_2$ Laser to evaporate ZnSe thin films may vary with different substrates: as to quartz substrates, using $1\times10^{-3}$ to $1\times10^{-6}$ torr of deposition pressure, 25 to 400° C. of deposition temperature, 3.6 to 20.2 Å/sec of growth rate, 6 to 70 watt of $CO_2$ laser power, 10 to 20 mA of ion beam current for an assisted deposition, 100 to 350 V of ion beam voltage; for GaAs (100) substrates, $1\times10^{-3}$ to $1\times10^{-6}$ torr of deposition pressure, 25 to 400° C. of deposition temperature, 2.8 to 20 Å/sec of growth rate, and using solution of aqua ammonia, hydrogen peroxide, and water at a ratio of 3:1:15 and bombardment of argon of ion beam (100 to 350 V, 10 to 25 mA) for 1 to 20 minutes to clear away the oxides on substrates surface.

Figure 1:
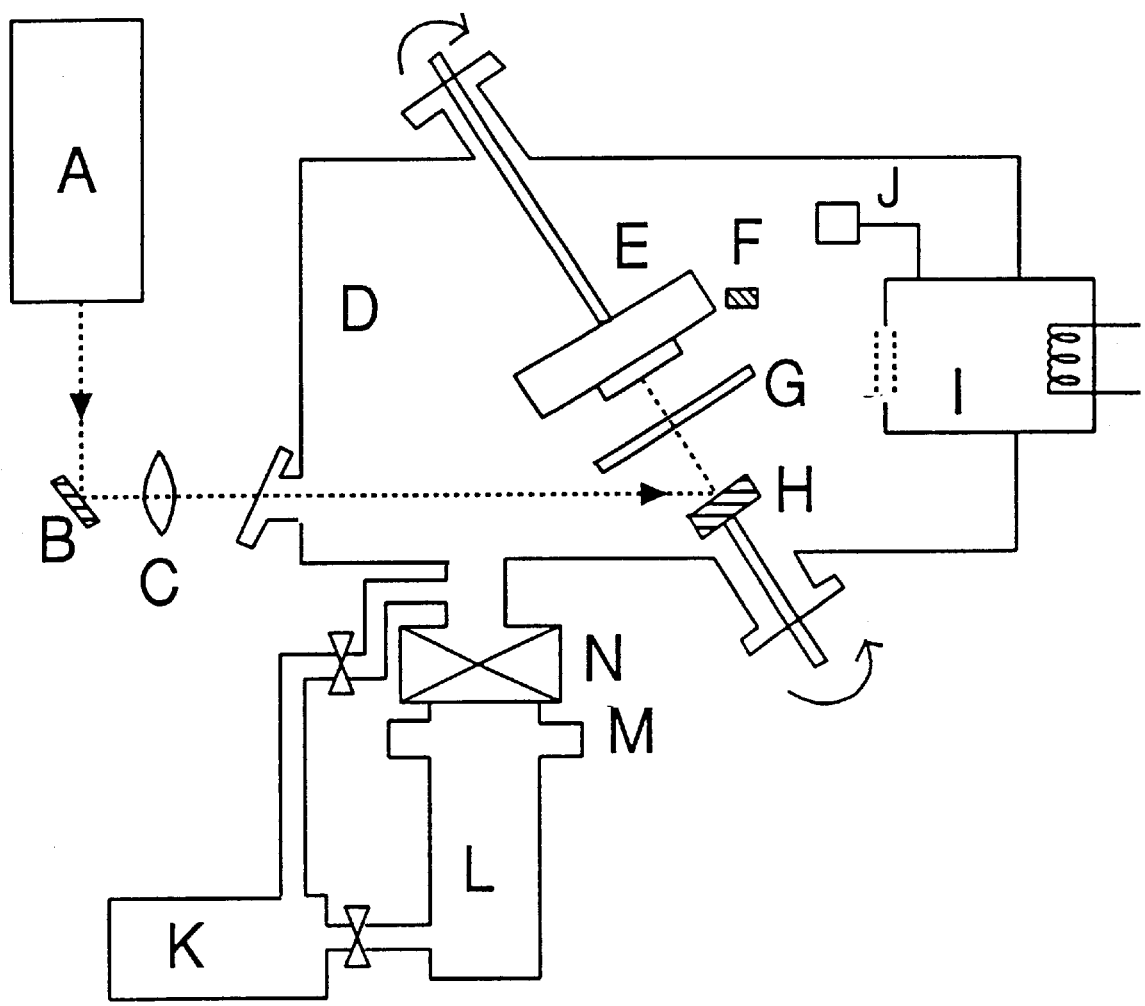
FIG. 1: CW $CO_2$ laser deposition system:
A. CW $CO_2$ laser;
B. Reflection lens;
C. Focus lens;
D. Vacuum chamber;
E. Substrate holder and heater;
F. Quartz thickness monitor;
G. Shutter;
H. ZnSe target;
I. 3 cm Kaufman-type ion source;
J. PBN;
K. Mechanical pump;
L. Diffusion pump;
M. Cold trap; and
N. Gate Valve.

FIG. 1 is an illustration of the CW $CO_2$ laser deposition, including a vacuum system with mechanical and diffusion pumps which could reach a vacuum pressure of $5\times10^{-6}$ torr. In the vacuum chamber, there is a ion beam used to assist grow films and clean substrates. The operation steps are: fill argon into the discharge chamber and plasma bridge neutralizer of the ion beam source, let it ionize and spray out with acceleration. The plasma bridge neutralizer is used to produce electron cloud to form neutral plasma. Via control of argon flow and ion beam voltage (100 to 350 V) and current (10 to 25 mA), adjustment of films growth rate (2.79 to 20.2 Å/s) by feedback control laser power, and change of substrate temperature by a programmable heater between ambient temperature and 400° C., either single or polycrystal can be attained.

According to the results of X-ray Diffraction Spectrometer, Raman Measure System and Photoluminescence, the quality of thin film on quartz glass and GaAs (001) substrates are analyzed respectively as follows:

1. For quartz substrates, attention is directed to FIG. 2.

Figure 2:
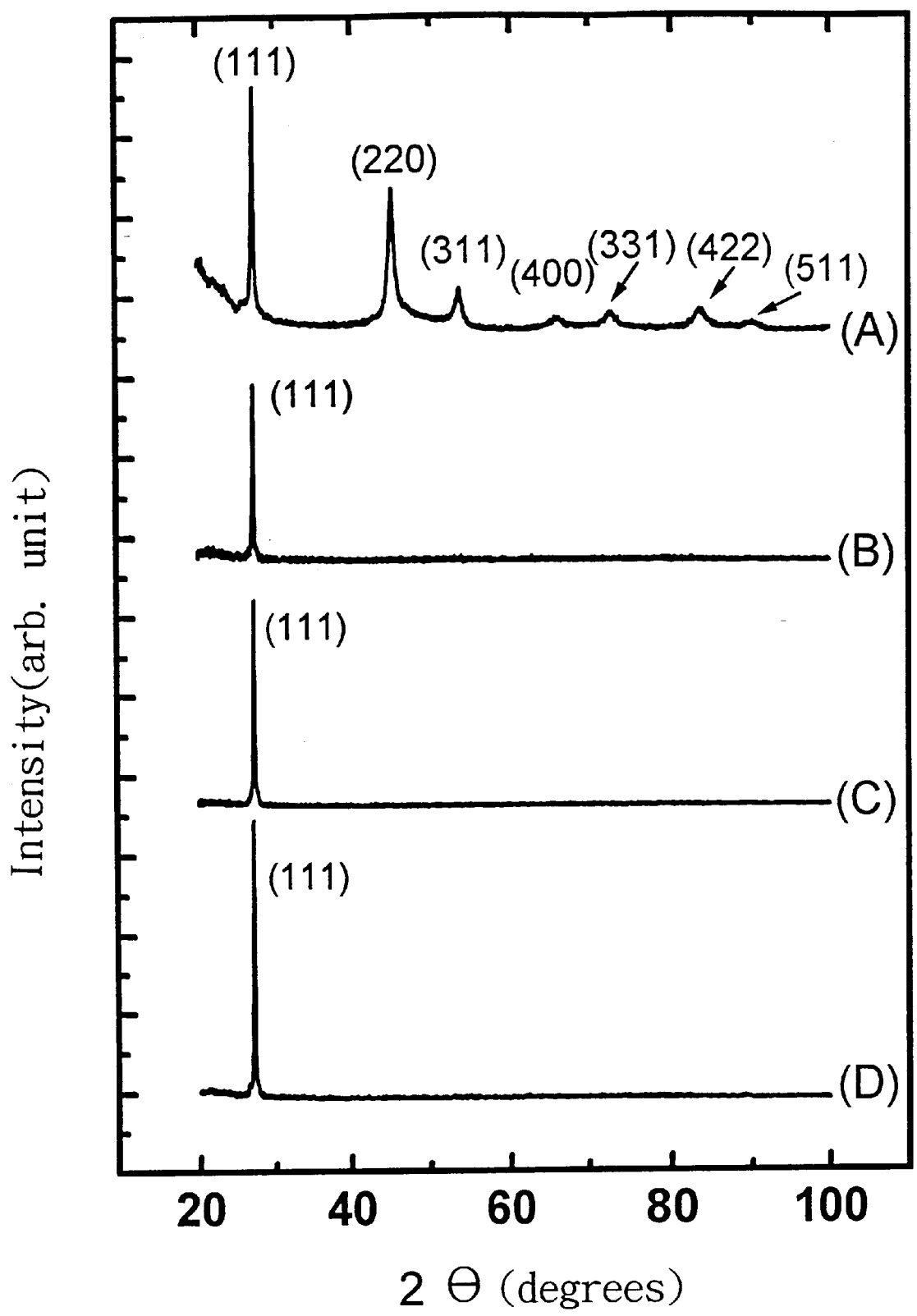
FIG. 2: X-ray diffraction plot of ZnSe thin film:
(A) ZnSe powder;
(B) ZnSe/quartz in ambient temperature;
(C) ZnSe/quartz at 150° C.; and
(D) ZnSe/quartz at 150° C. with ion beam assisted deposition.

In FIG. 2 the X-ray Diffraction of ZnSe thin films shows variations of intensity of ZnSe (111) thin films surface at different conditions: $1\times10^{-3}$ to $1\times10^{-6}$ torr of deposition pressure, 25 to 400° C. of deposition temperature, 3.6 to 20.2 Å/sec of growth rate, 6 to 70 watt of $CO_2$ laser power, 10 to 20 mA of ion beam current for deposition, 100 to 350 V of ion beam voltage. In the cases of 150° C. and with ion beam assisted deposition, the films quality could be excellent.

Figure 3:
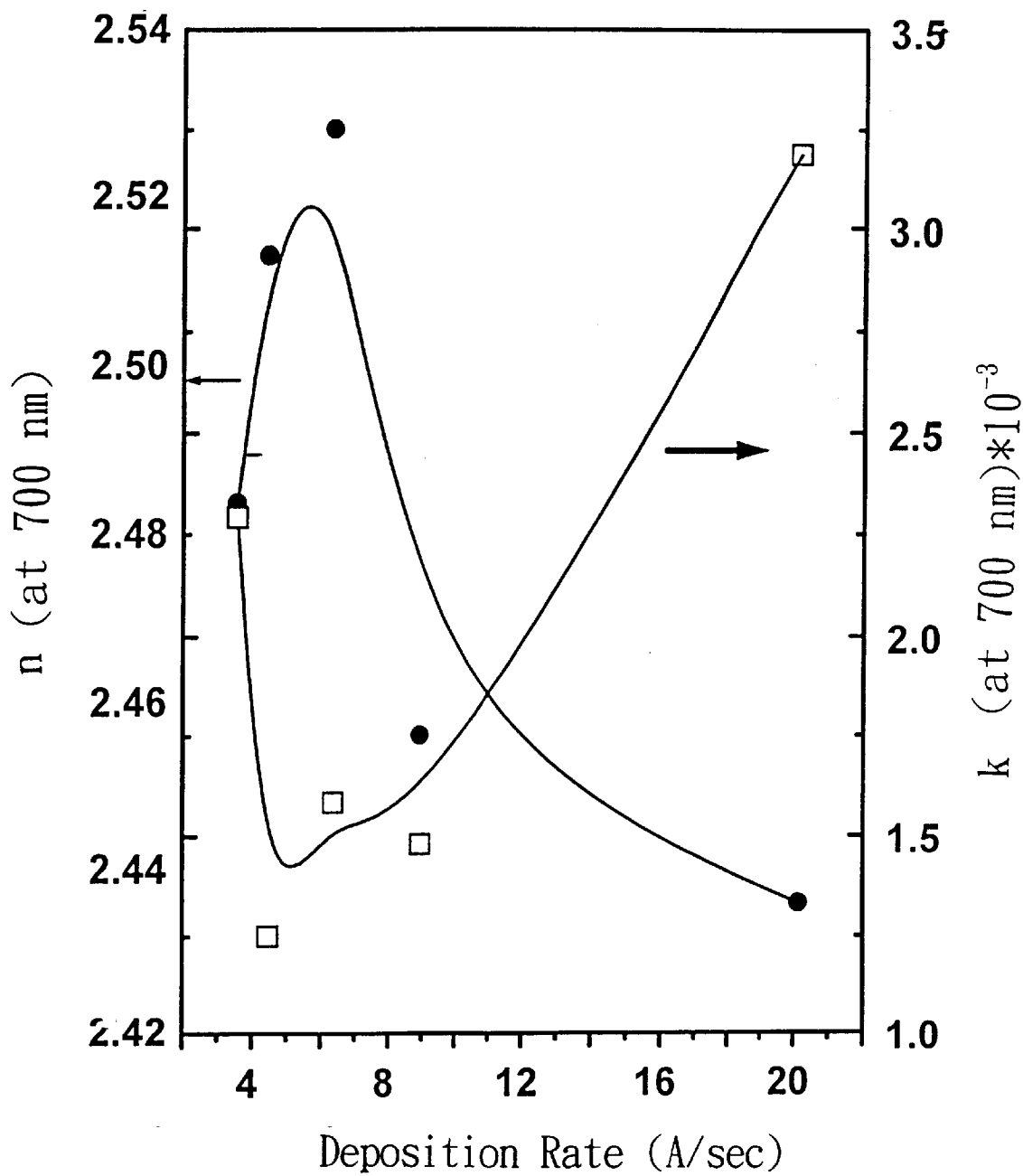
FIG. 3: With different deposition rate, refractive index (n), extinction coefficient (k) change at 700 nm; and
Substrate temperature: 150° C., thickness: 550 nm

In FIG. 3, it shows that, with different deposition rate, refractive index (n) and extinction coefficient (k) change at a wavelength of 700 mm.

Figure 4:
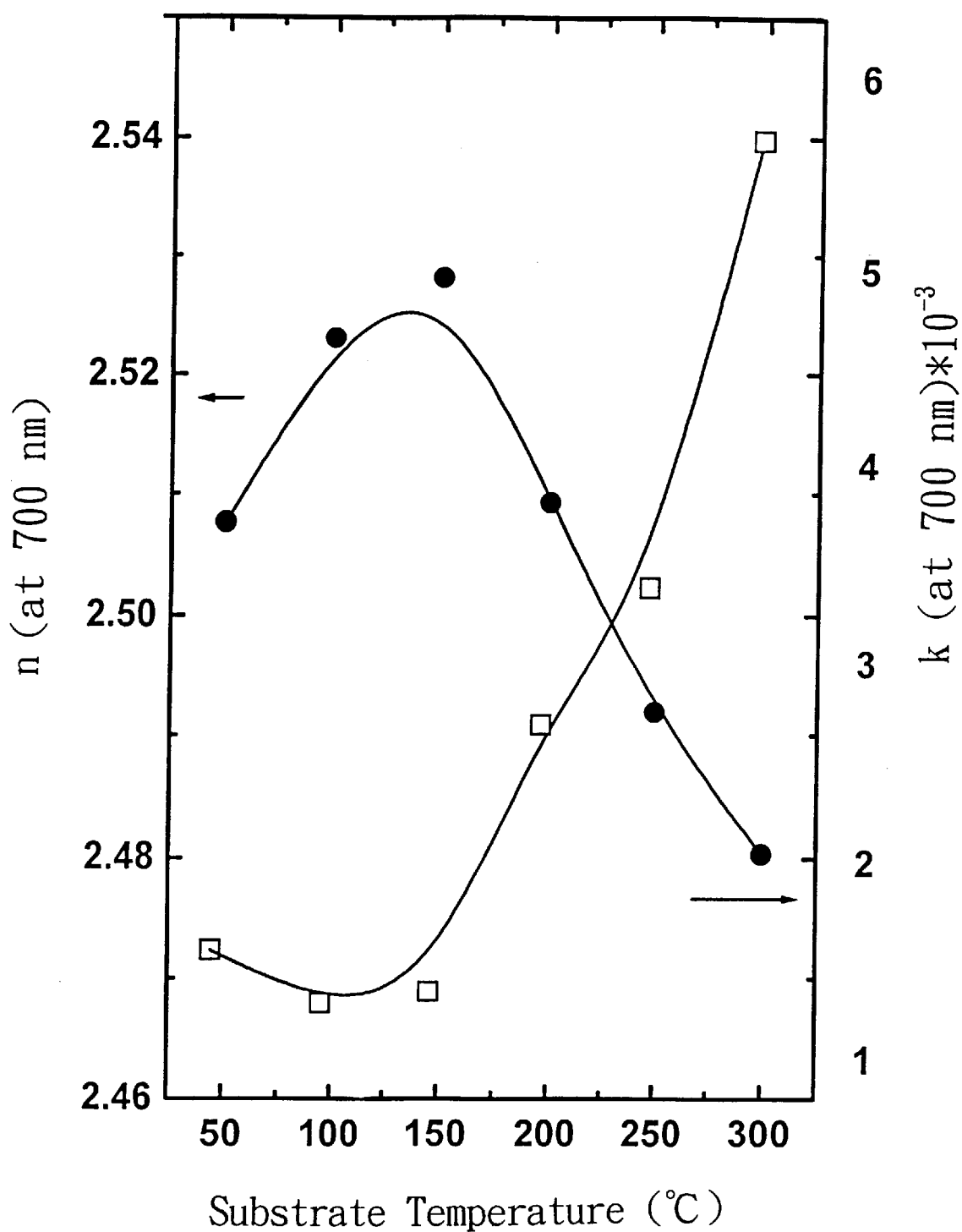
FIG. 4: With different substrate temperature, refractive index (n), extinction coefficient (k) change at 700 nm;
deposition rate: 6.4 Å/sec; and
thickness: 550 mm.
Figure 5:
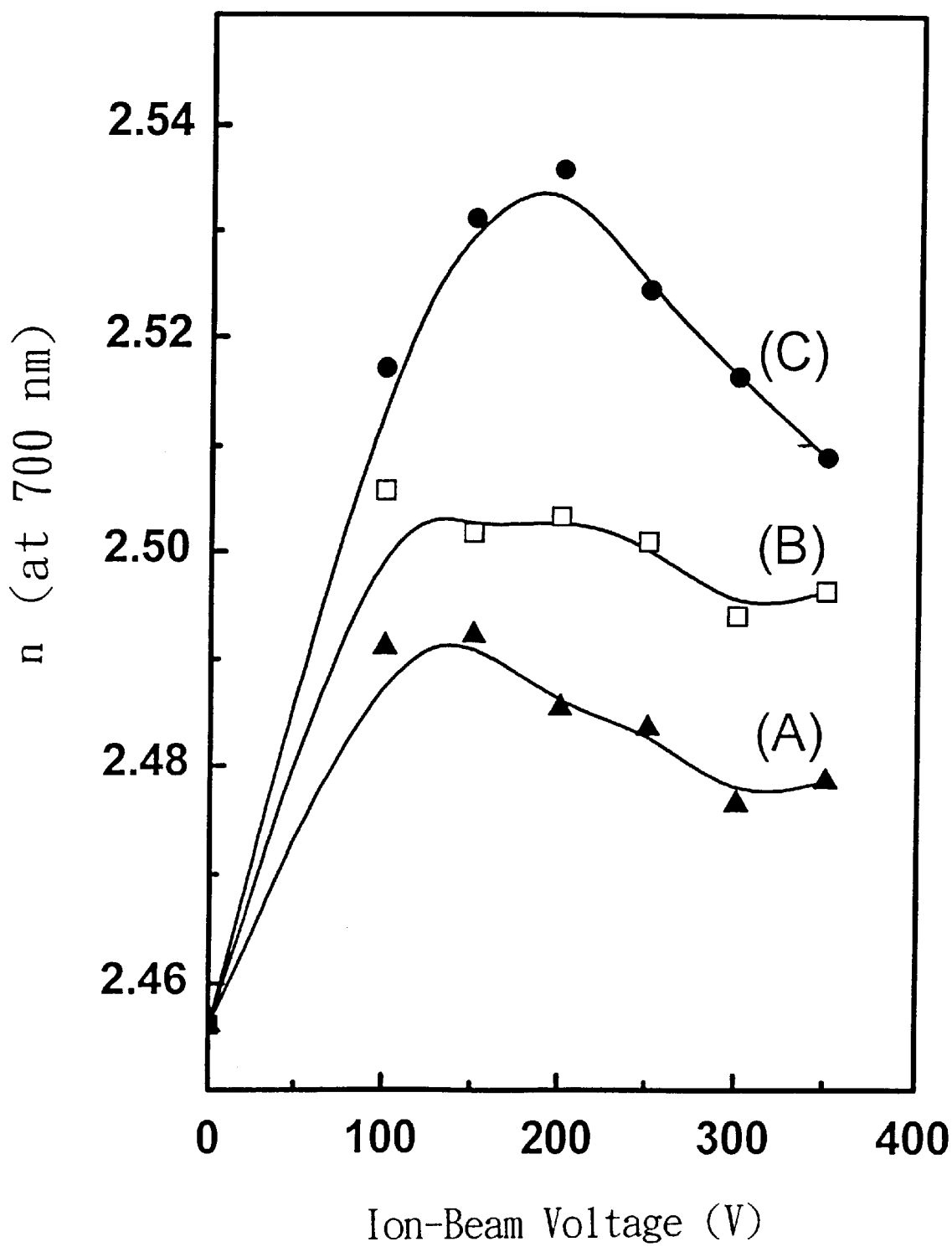
FIG. 5: With ion beam assisted condition, refractive index(n) changes with ion beam current:
deposition rate=9 Å/sec, thickness 550 nm;
substrate temp: 150° C.; and
(A) 20 mA, (B) 10 mA, (C) 15 mA.
Figure 6:
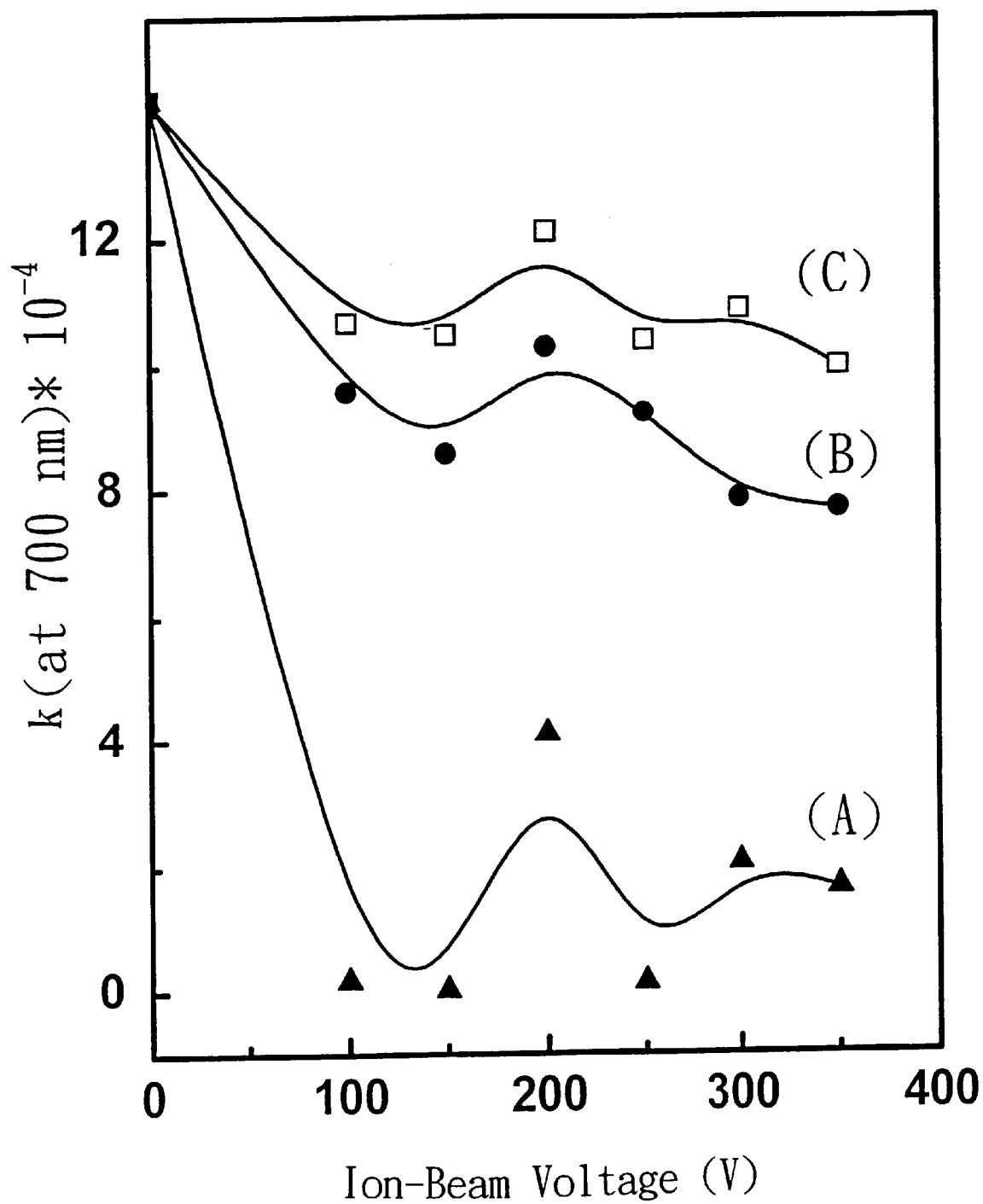
FIG. 6: With ion beam assisted condition, extinction coefficient(k) changes with ion beam current:
deposition rate=9 Å/sec, thickness 550 nm;
substrate temp: 150° C.; and
(A) 20 mA, (B) 10 mA, and (C).

In FIG. 4, with different substrate temperature, n and k are changed at a wavelength of 700 mm. It is assured that the best optical quality can be achieved at 150° C. In FIGS. 5 and 6, it indicates the distribution chart of n and k with the help of ion beam when ion beam current changes. It is apparent that the largest n value equal to 2.536 can be attained under the process conditions of 15 mA of current and 200 V of voltage, close to the value of 2.540 obtained from bulk material at 700 mm, and that the ion beam is really of great help to reduce the extinction coefficient (k) value of ZnSe thin films.

Figure 7:
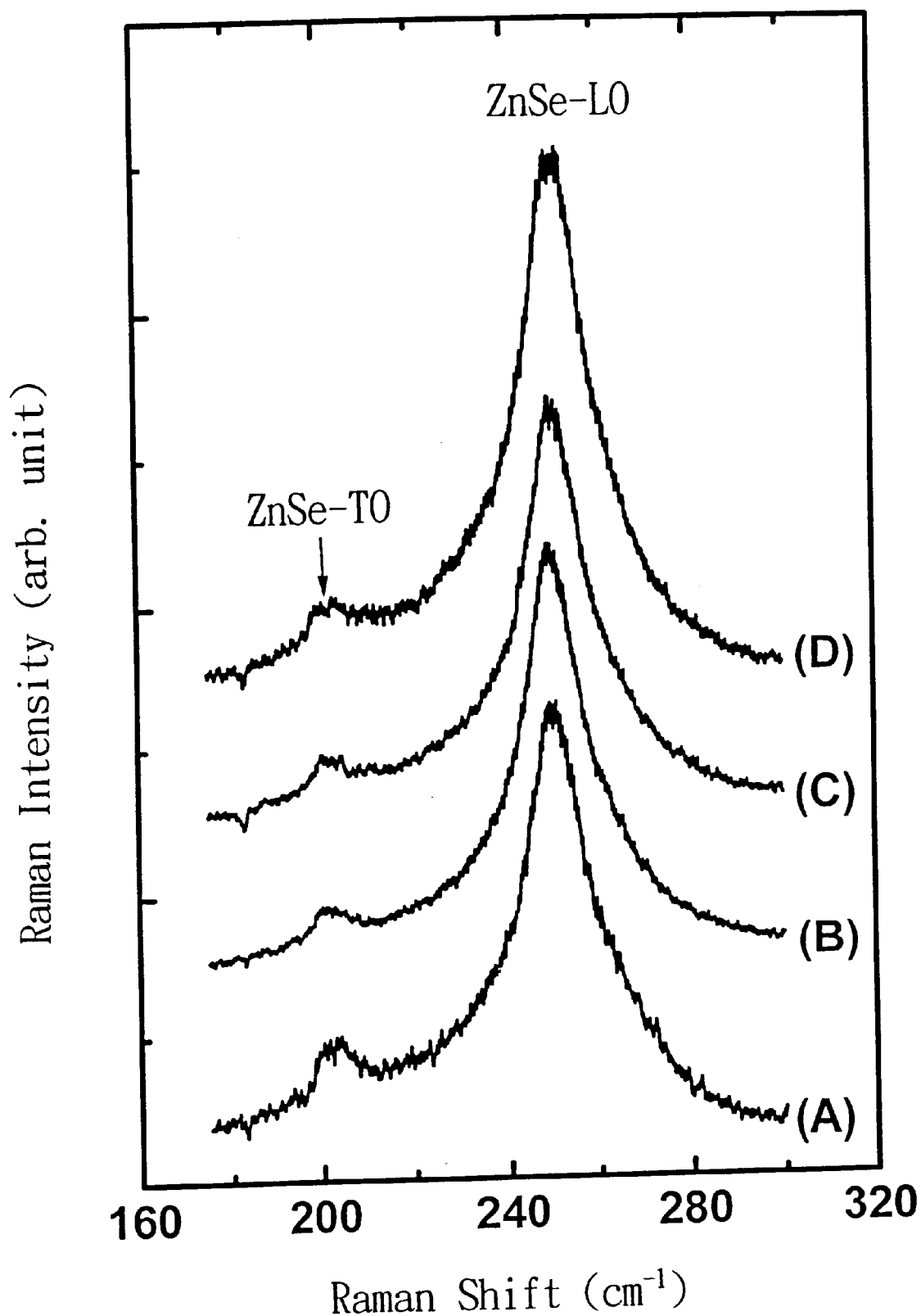
FIG. 7: Variations Changes of Raman Spectroscopy with different current of ion beam:
(A) Without, (B) 10 mA, (C) 15 MA, and (D) 20 mA.

FIG. 7 shows the changes of Raman Spectroscopy when the ion beam current is different.

Accordingly, the crystallization of thin films is better when ion beam is used. From the above measurements, one can set up a criterion for growing high quality ZnSe films.

For GaAs (100) substrates one should have $1\times10^{-3}$ to $1\times10^{-6}$ torr of deposition pressure, 25 to 400° C. of deposition temperature, 2.8 to 20 Å/sec of growth rate, and use the solution of aqua ammonia, hydrogen peroxide and water at a ratio of 3:1:15 to clear away the oxides on substrate surface before putting the substrate into the vacuum chamber, after putting the substrate into the vacuum chamber using bombardment of argon of ion beam (100 to 350 V, 10 to 25 mA) for 1 to 20 minutes to remove the residual oxides on substrate surface after solution cleaning.

Figure 8:
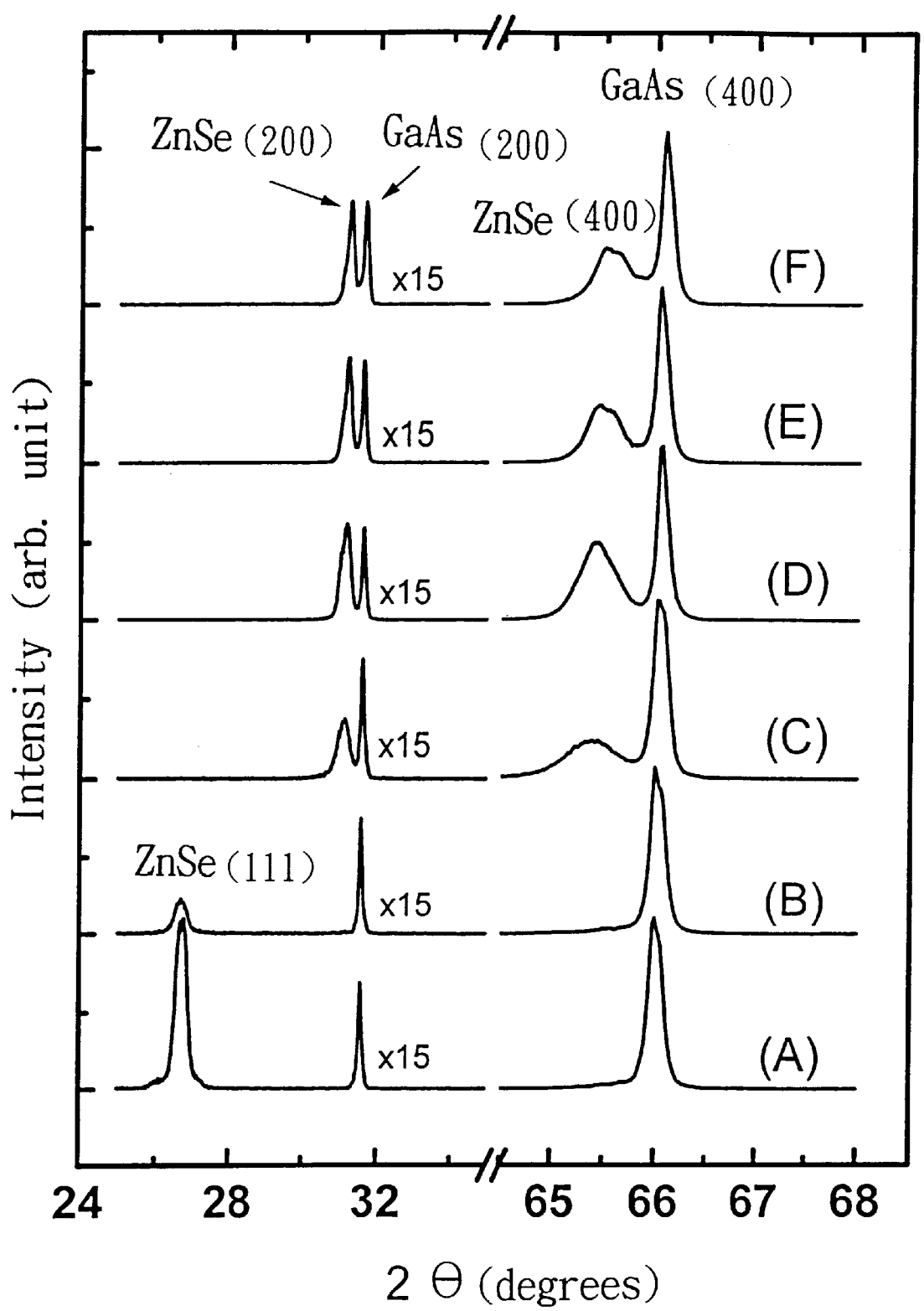
FIG. 8: X-ray diffraction figure of ZnSe thin film at different GaAs substrate temperature:
(A) 100° C., (B) 150° C., (C) 200° C., (D) 300° C., (E) 350° C., and (F) 400° C.

In FIG. 8, it shows that changes of ZnSe films's X-ray Diffraction at different substrate temperature (ranging from 100 to 400° C.), at (111), (200) and (400) peak value. At low temperature conditions (lower than 200° C.), presence of ZnSe (111) reveals that the thin films formed are still polycrystal structures. With the temperature raising higher than 200° C., it can be observed that (111)'s peak decay, (200) and (400)'s peak values appear. Among which, the quality obtained at 400° C. is the best.

Figure 9:
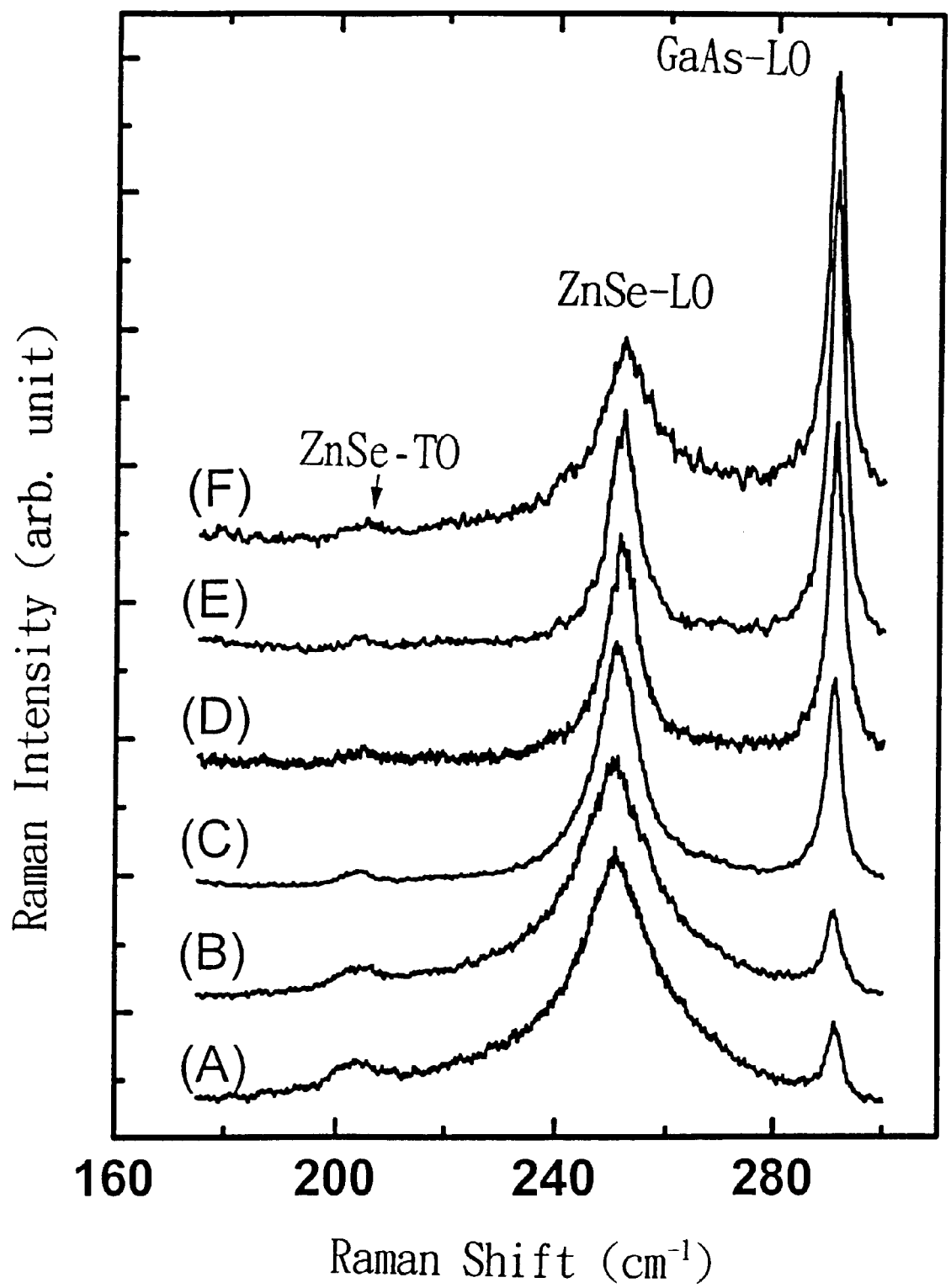
FIGS. 9(a)–(b): Raman Spectroscopy and stress at different substrate temperature:
(a) Raman Spectroscopy at different substrate temperature; and (b) stress at different substrate temperature:
(A) 100° C., (B) 150° C., (C) 200° C., (D) 300° C., (E) 350° C., and (F) 400° C.
Figure 9:
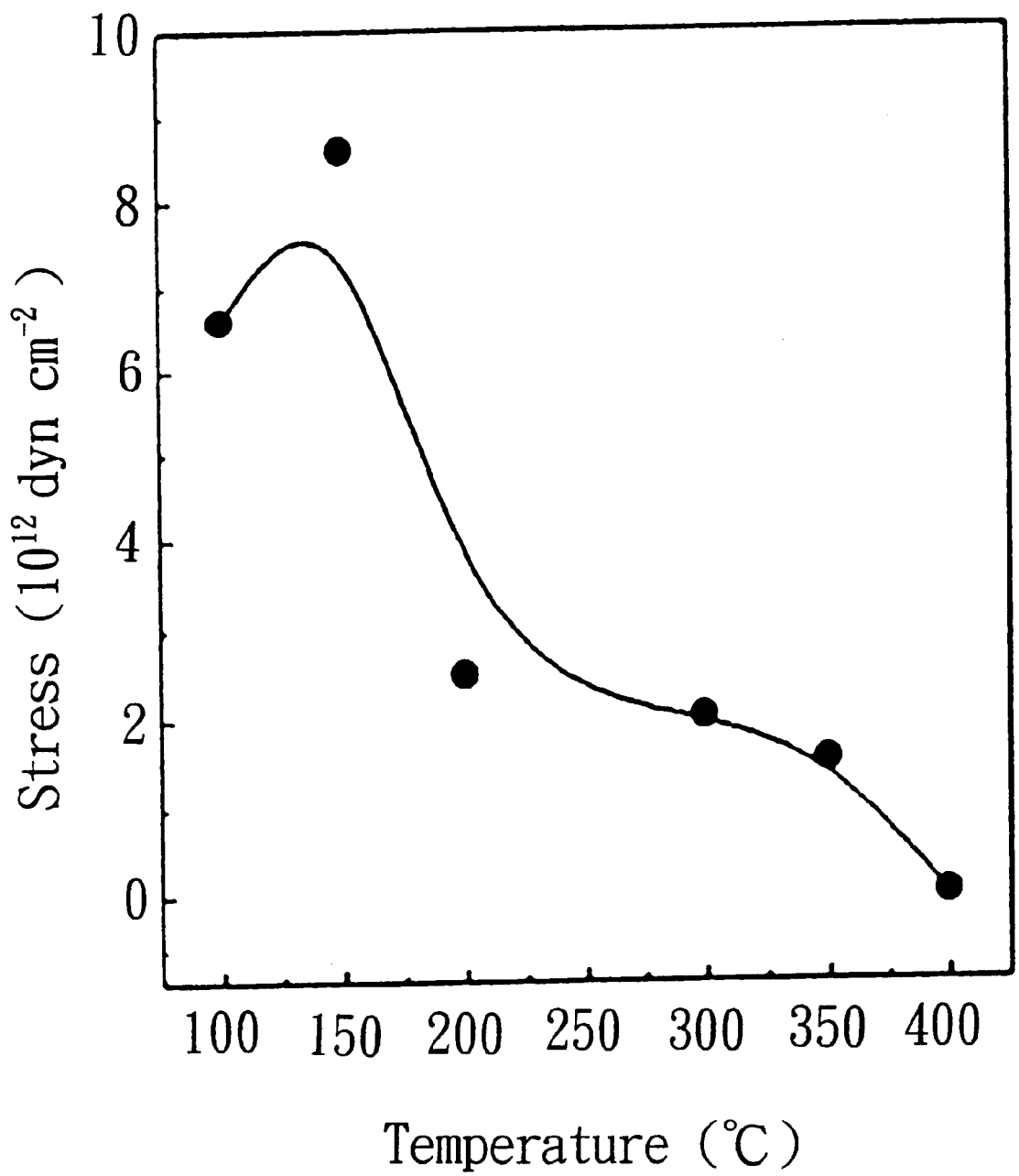

FIG. 9 shows the changes of Raman Spectroscopy at different substrate temperatures. The stress between single crystal ZnSe and GaAs substrates is the lowest at 400° C.

Figure 10:
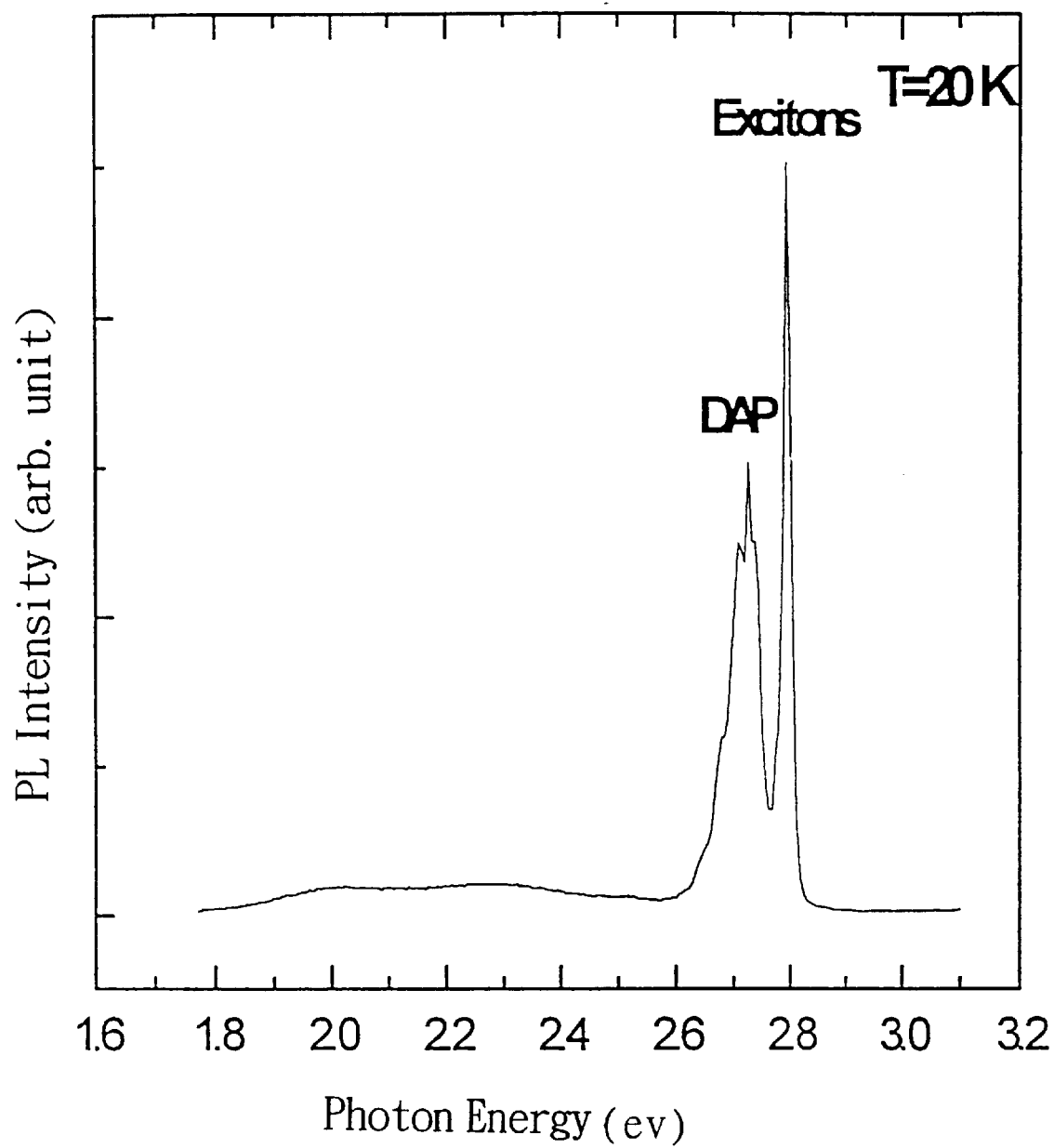
FIGS. 10(a)–(b): 20 K low temperature Light Excitation Spectroscopy of ZnSe thin films at 400° C.:
(a) 20 k low temperature Light Excitation Spectroscopy of ZnSe thin films with photon energy ranged from 1.8 ev to 3.1 ev, and
(b) 20 k low temperature Light Excitation Spectroscopy of ZnSe thin films with photon energy ranged from 2.6 ev to 2.85 ev.
Figure 10:
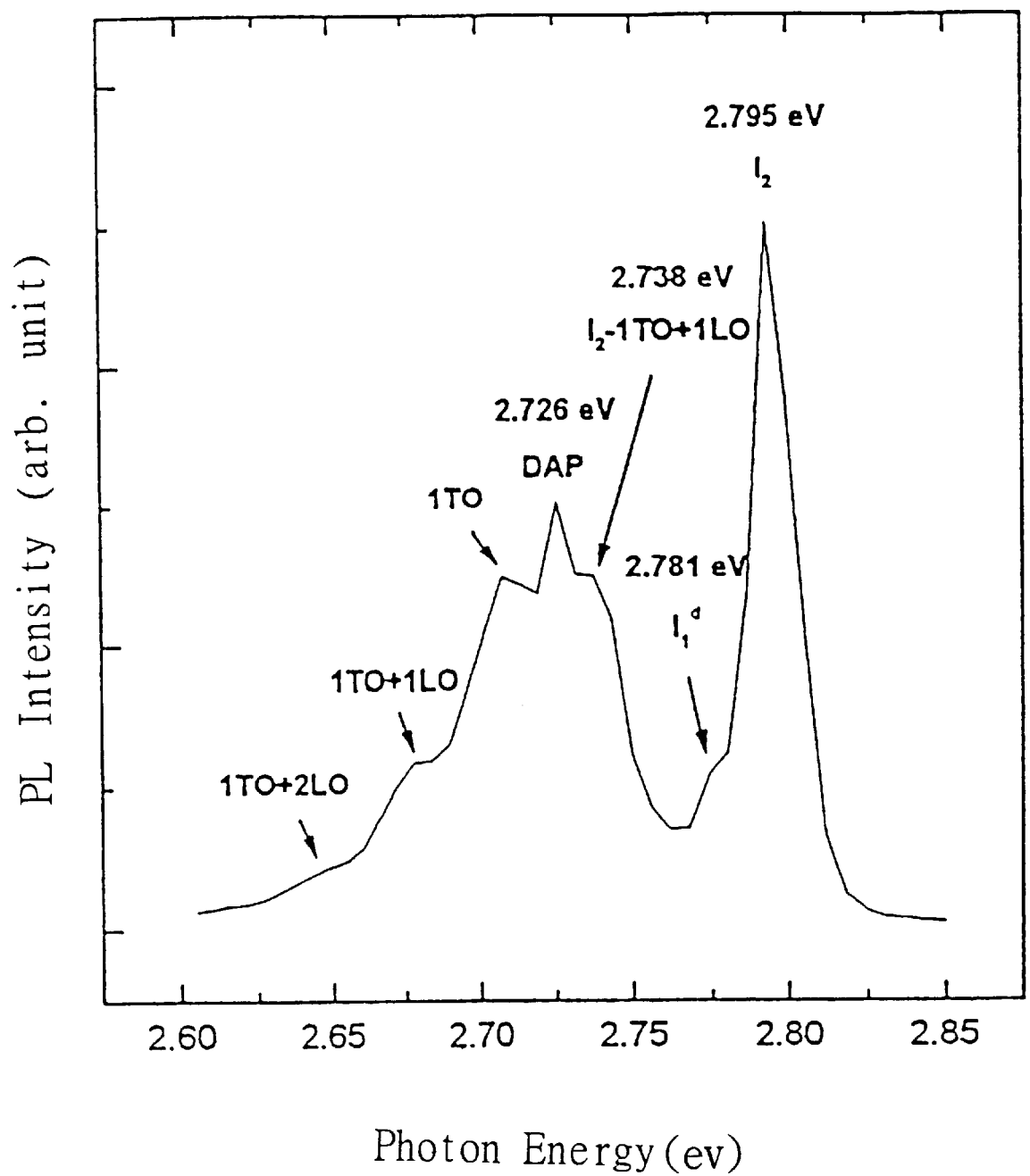
Figure 11:
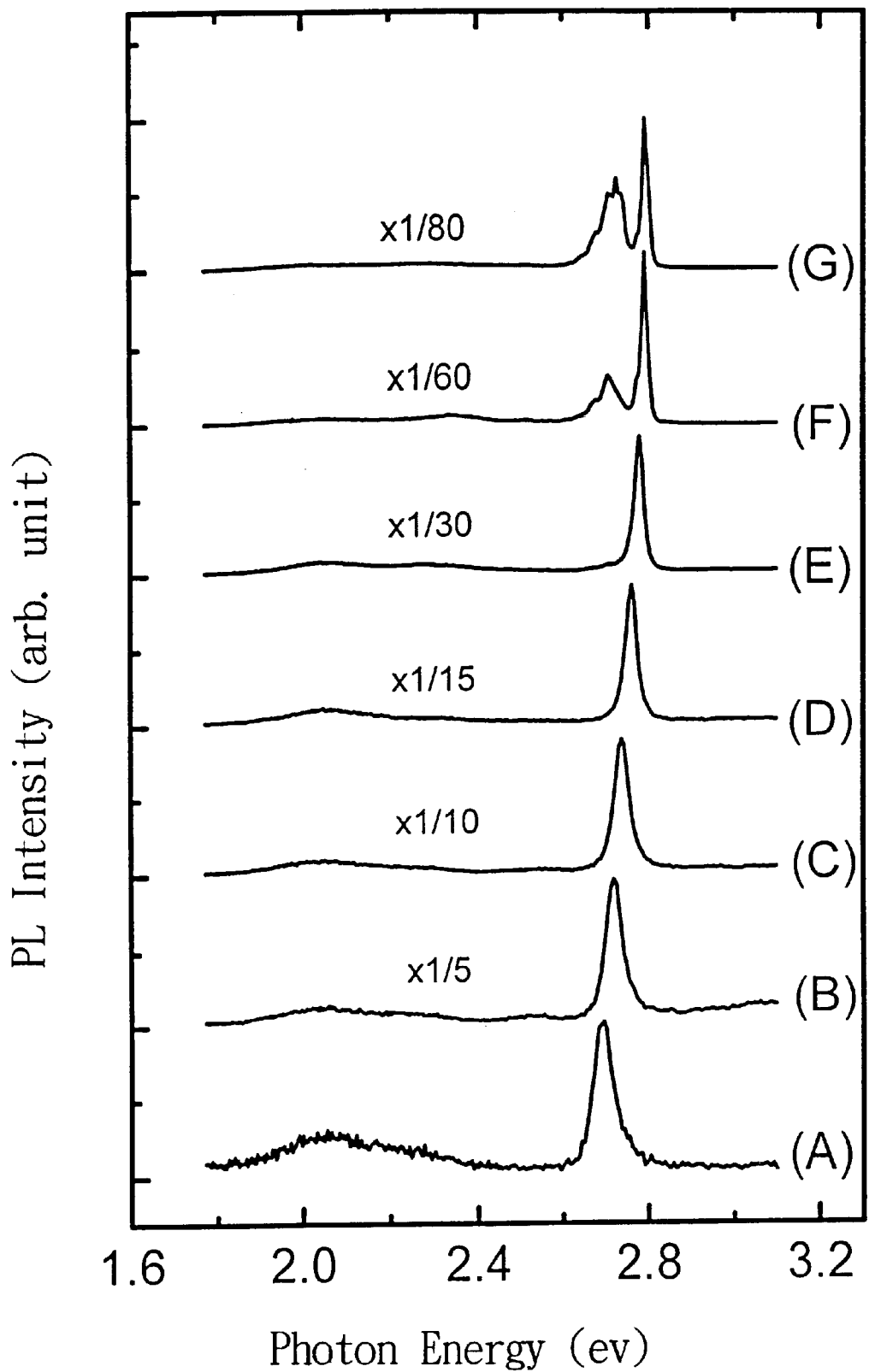
FIG. 11: Temperature-variable Light Excitation Spectroscopy of ZnSe thin films at 400° C.:
(A) 300 K, (B) 250 K, (C) 200 K, (D) 150 K, (E) 100 K, (F) 50 K, and (G) 20 K.

FIGS. 10 and 11 are photoluminescence of ZnSe thin films at 400° C. One can see the relativity between exciton and donor-acceptor pair and the relations when temperature varies.

This invention reveals that the ZnSe thin films obtained on GaAs substrates by using Continual Carbon Dioxide Laser can achieve rather high quality. Compared with MOVCD and MBE, it surely is safer and more inexpensive. Not only does it save a lot of costs on equipment, but reduces pollution and thermal radiation (only ZnSe targets are heated with laser). Furthermore, no splash will happen as often seen in PLD method. Growth of ZnSe thin films is fundamentally important in producing blue light diodes and blue light laser. Blue light diodes are an indispensable component for manufacturing true color sign substrates and blue and purple detectors. They can also replace traditional laser read-and-write heads of current CD and DVD devices, the data volumes of which can be increased four times. The invention is really a vital technique in growing high quality, high light emitting and long live components.

What is claimed is:

1. A method for preparing ZnSe thin films by ion-assisted continuous wave $CO_2$ laser deposition for blue light emitting devices, comprising the steps of:

providing process conditions of $1\times10^{-3}$ to $1\times10^{-6}$ torr for a deposition pressure, 25 to 400° C. for a deposition temperature, 3.6 to 20.2 Å/sec for a growth rate, 6 to 70 watt for a $CO_2$ laser power, 10 to 20 mA of ion beam current for the assisted deposition, and 100 to 350 V for an ion beam voltage;

using a $CO_2$ laser to cause evaporation in the assisted deposition with an ion beam directed at deposition surfaces for growing said ZnSe thin films on substrates to manufacture optical multilayer films and anti-reflection coatings for said blue light emitting devices;

using a solution of aqua ammonia, hydrogen peroxide, and water at a ratio of 3:1:15, then a bombardment of argon of ion beam (100 to 350 V, 10 to 25 mA) for 1 to 20 minutes to clear away oxides on said substrates surfaces before said growing.

2. The method according to claim 1, further comprising the step of selecting said substrates selected from the group consisting of quartz glass substrates, GaAs substrates, ZnSe substrates and sapphire substrates.

3. The method according to claim 2, further comprising the step of:

growing a GaN film on the substrates.

* * * * *